United States Patent
Moriie et al.

(10) Patent No.: US 6,795,129 B1
(45) Date of Patent: Sep. 21, 2004

(54) METHOD AND APPARATUS FOR DIGITAL BROADCAST CHANNEL SELECTION BY FREQUENCY SEARCHING IN A STEP-WISE FASHION

(75) Inventors: Yoshihiro Moriie, Kashihara (JP); Hiroshi Kato, Takatsuki (JP); Tsuyoshi Kawakami, Kobe (JP); Misao Teshima, Ibaraki (JP); Kenichi Maehara, Ibaraki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 392 days.

(21) Appl. No.: 09/786,445
(22) PCT Filed: Jul. 4, 2000
(86) PCT No.: PCT/JP00/04417
§ 371 (c)(1),
(2), (4) Date: Jun. 4, 2001
(87) PCT Pub. No.: WO01/03297
PCT Pub. Date: Jan. 11, 2001

(30) Foreign Application Priority Data

| Jul. 6, 1999 | (JP) | 11-191585 |
| Jun. 22, 2000 | (JP) | 2000-187378 |

(51) Int. Cl.$^7$ .................................................. H04N 5/50
(52) U.S. Cl. ................................. 348/732; 348/735
(58) Field of Search .............................. 348/731, 732, 348/735; 375/321, 344; 455/161.1, 161.2, 161.3, 166.1, 166.2, 182.1, 182.2, 184.1, 185.1, 186.1, 192.1, 192.2, 167.1

(56) References Cited

U.S. PATENT DOCUMENTS

| 4,387,401 A | * | 6/1983 | Henderson et al. ......... 348/732 |
| 4,397,038 A | * | 8/1983 | Rzeszewski ............. 455/183.2 |
| 4,442,413 A | * | 4/1984 | Hayashida et al. ......... 331/1 A |
| 4,485,404 A | * | 11/1984 | Tults ........................ 348/735 |
| 4,763,195 A | * | 8/1988 | Tults ........................ 348/732 |
| 5,416,774 A | | 5/1995 | Shigematsu et al. ....... 370/69.1 |
| 5,428,405 A | | 6/1995 | Lee ............................ 348/731 |
| 5,483,686 A | | 1/1996 | Saka et al. |
| 5,598,228 A | * | 1/1997 | Saitoh ....................... 348/732 |
| 5,638,140 A | * | 6/1997 | Krishnamurthy et al. ... 348/735 |
| 6,067,332 A | * | 5/2000 | Taura et al. ................ 375/344 |
| 6,137,546 A | * | 10/2000 | Shintani et al. ............ 348/731 |
| 6,173,164 B1 | * | 1/2001 | Shah ....................... 455/182.1 |
| 6,240,147 B1 | * | 5/2001 | Muramatsu et al. ........ 375/344 |
| 6,297,858 B1 | * | 10/2001 | Yang ......................... 348/731 |

FOREIGN PATENT DOCUMENTS

| JP | 59-152717 | 8/1984 |
| JP | 1-156631 | 10/1989 |
| JP | 4-150609 | 5/1992 |
| JP | 4-196824 | 7/1992 |
| JP | 6-152664 | 5/1994 |

OTHER PUBLICATIONS

Canadian Office dated Jul. 15, 2003.
European Search Report dated Feb. 12, 2004.

* cited by examiner

*Primary Examiner*—Victor R. Kostak
(74) *Attorney, Agent, or Firm*—Armstrong, Kratz, Quintos, Hanson & Brooks, LLP

(57) ABSTRACT

An 8VSB decoder detects whether or not a digital tuner can tune in to a broadcasting signal on a selected channel, and a channel selection frequency control portion shifts, when it is detected that the broadcasting signal on the selected channel cannot be tuned in to, PLL data to the high frequency side or the low frequency side and outputs the PLL data to the digital tuner.

12 Claims, 4 Drawing Sheets

FIG. 2

| CHANNEL No. | PLL DATA | SHIFT AMOUNT | RESULT OF TUNING |
|---|---|---|---|
| 2 | $f_2$ | $+0$ | ○ |
| 3 | $f_3$ | $+f_A$ | ○ |
| 4 | $f_4$ | $+0$ | × |
| 5 | $f_5$ | $+0$ | × |
| 6 | $f_6$ | $-f_A$ | ○ |
| ⋮ | ⋮ | ⋮ | ⋮ |

METHOD AND APPARATUS FOR DIGITAL BROADCAST CHANNEL SELECTION BY FREQUENCY SEARCHING IN A STEP-WISE FASHION

TECHNICAL FIELD

The present invention relates to a digital broadcasting channel selection apparatus and a digital broadcasting channel selection method in which a broadcasting signal on a channel selected from digital broadcasting is turned in to.

BACKGROUND ART

In recent years, broadcasting has been digitized, and various types of digital broadcasting such as BS (Broadcasting Satellite) digital broadcasting, cable television (CATV) broadcasting, and ground wave digital broadcasting have been developed. In the digital broadcasting, programs on a plurality of channels are broadcast, and a digital broadcasting channel selection apparatus is used in order for a viewer to select a broadcasting signal on the desired channel.

In a conventional digital broadcasting channel selection apparatus, therefore, a local oscillation signal corresponding to the center frequency of a carrier wave for a broadcasting signal is mixed with an RF (Radio Frequency) signal received through a parabolic antenna or the like to convert the RF signal into an IF (Intermediate Frequency) signal, to tune in to the broadcasting signal on the desired channel.

At this time, the local oscillation frequency of the local oscillation signal is controlled by AFT (Automatic Fine Tuning) such that the IF signal has a predetermined intermediate frequency, and PLL (Phase-Locked Loop) control is used in order to control the local oscillation frequency to a desired frequency, to tune in to a broadcasting signal having a center frequency within a lead-in range by the PLL control.

In the conventional digital broadcasting channel selection apparatus, however, the lead-in range by the PLL control is limited to a predetermined frequency range. When the center frequency of the carrier wave for the broadcasting signal is outside the lead-in range, the broadcasting signal cannot be tuned in to. For example, in CATV in the United States, the center frequency $f_{RF}$ of the carrier wave for the broadcasting signal may, in some cases, be shifted in a range of ±300 kHz from a nominal value. The shift in the frequency is within a standard range in the CATV in the United States. When the frequency lead-in range by the PLL control is a range of ±150 kHz, centered at the center frequency $f_{RF}$ of the carrier wave for the broadcasting signal, however, the broadcasting signal cannot be tuned in to.

DISCLOSURE OF THE INVENTION

An object of the present invention is to provide a digital broadcasting channel selection apparatus and a digital broadcasting channel selection method in which a broadcasting signal on a desired channel can be tuned in to even when the frequency precision of a carrier wave for the broadcasting signal is low.

A digital broadcasting channel selection apparatus according to an aspect of the present invention is a digital broadcasting channel selection apparatus for tuning in to a broadcasting signal on a channel selected from digital broadcasting, comprising selection means for selecting a channel in digital broadcasting; frequency setting means for setting a channel selection frequency corresponding to the channel selected by the selection means; tuning means for tuning in to the broadcasting signal using the channel selection frequency set by the frequency setting means; and detection means for detecting whether or not the tuning means can tune in to the broadcasting signal on the selected channel and notifying the frequency setting means of the result of the detection, the frequency setting means shifting, when the detection means detects that the tuning means cannot tune in to the broadcasting signal on the selected channel, the channel selection frequency to the high frequency side or the low frequency side.

In the digital broadcasting channel selection apparatus, the channel selection frequency corresponding to the selected channel is set, and the broadcasting signal is tuned in to using the set channel selection frequency. At this time, when it is detected that the broadcasting signal on the selected channel cannot be tuned in to, the channel selection frequency is shifted to the high frequency side or the low frequency side.

At the time of the channel selection after shifting the channel selection frequency, therefore, the broadcasting signal can be tuned in to using the channel selection frequency shifted to the high frequency side or the low frequency side. Even in a case where the center frequency of the carrier wave for the broadcasting signal on the selected channel is shifted from a nominal value and deviates from a lead-in range based on the first channel selection frequency, therefore, when the center frequency of the carrier wave for the broadcasting signal on the selected channel exists in the lead-in range after the shifting, the broadcasting signal on the selected channel can be tuned in to. As a result, even when the frequency precision of the carrier wave for the broadcasting signal is low, the broadcasting signal on the desired channel can be tuned in to.

It is preferable that the frequency setting means shifts the channel selection frequency to the high frequency side or the low frequency side, and then shifts, when the detection means detects again that the tuning means cannot tune in to the broadcasting signal on the selected channel, the channel selection frequency to the opposite side.

In this case, the channel selection frequency is shifted to the high frequency side or the low frequency side, and the channel selection frequency is then shifted to the opposite side when it is detected again that the broadcasting signal on the selected channel cannot be tuned in to. When the center frequency of the carrier wave for the broadcasting signal on the selected channel is shifted in the opposite direction to the direction in which it is first shifted, therefore, the broadcasting signal on the selected channel can be tuned in to by shifting the channel selection frequency to the opposite side.

The frequency setting means may successively shift the channel selection frequency to the high frequency side or the low frequency side until the tuning means can tune in to the broadcasting signal on the selected channel.

In this case, the channel selection frequency is successively shifted to the high frequency side or the low frequency side until the broadcasting signal on the selected channel can be tuned in to. Even when the center frequency of the carrier wave for the broadcasting signal on the selected channel is greatly shifted, therefore, the broadcasting signal on the selected channel can be tuned in to by successively shifting the channel selection frequency.

It is preferable that the frequency setting means stops an operation for shifting the channel selection frequency when the tuning means cannot tune in to the broadcasting signal on the selected channel after the channel selection frequency is shifted a predetermined number of times.

In this case, when the broadcasting signal on the selected channel cannot be tuned in to after the channel selection frequency is shifted a predetermined number of times, the operation for shifting the channel selection frequency is stopped. In cases such as a case where broadcasting on the selected channel is not performed, therefore, a channel selection operation can be stopped without being uselessly continued.

It is preferable that the digital broadcasting channel selection apparatus further comprises recording means for recording for each channel the amount of shift in the channel selection frequency corresponding to the channel, the frequency setting means recording, when the detection means detects that the tuning means can tune in to the broadcasting signal on the selected channel, the amount of shift in the channel selection frequency corresponding to the channel on the recording means as well as shifting the channel selection frequency by the amount of shift recorded on the recording means when the channel selection frequency is set in the tuning means.

In this case, when it is detected that the broadcasting signal on the selected channel can be tuned in to, the amount of shift in the channel selection frequency corresponding to the channel is recorded on the recording means, and the channel selection frequency is shifted by the amount of shift recorded on the recording means when the channel selection frequency is set. At the subsequent channel selection, therefore, the channel can be tuned in to by shifting the channel selection frequency by an amount of shift in which the channel could be selected last time. Accordingly, the desired channel can be quickly tuned in to without performing a useless channel selection operation.

The frequency setting means may record on the recording means for each channel the result of the detection whether or not the tuning means can tune in to the broadcasting signal on the selected channel.

In this case, the result of the detection whether or not the broadcasting signal on the selected channel can be selected is recorded on the recording means for each channel. For example, a viewer can be notified that when an instruction to tune in to the same channel is issued since that time, the channel cannot be tuned in to, or the channel which cannot be tuned in to at the time of an auto-channel operation for automatically raising or lowering the channel can be skipped. Accordingly, it is possible to restrain an operation for tuning in to the channel which may not be or is hardly tuned in to.

It is preferable that the tuning means converts the broadcasting signal tuned in to using the channel selection frequency set by the frequency setting means into an intermediate frequency signal and outputs the intermediate frequency signal, and the detection means detects whether or not the broadcasting signal on the selected channel can be tuned in to on the basis of the result of decoding of the intermediate frequency signal outputted from the tuning means.

In this case, the broadcasting signal tuned in to is converted into the intermediate frequency signal, and it is detected whether or not the broadcasting signal on the selected channel can be tuned in to on the basis of the result of the decoding of the intermediate frequency signal obtained by the conversion. Accordingly, it can be detected whether or not the broadcasting signal is a broadcasting signal on the selected channel using the result of the decoding, for example, various types of information included in a transport stream. Accordingly, it is possible to reliably detect not only that the channel can be merely tuned in to but also whether or not the channel tuned in to is the selected channel. As a result, even when a plurality of broadcasting signals exist in the lead-in range based on the set channel selection frequency, the broadcasting signal on the channel selected by the viewer can be reliably tuned in to.

A digital broadcasting channel selection method according to another aspect of the present invention is a digital broadcasting channel selection method for tuning in to a broadcasting signal on a channel selected from digital broadcasting, characterized by comprising the steps of setting a channel selection frequency corresponding to the selected channel; tuning in to the broadcasting signal using the set channel selection frequency; detecting whether or not the broadcasting signal on the selected channel can be tuned in to in the tuning step; and shifting, when it is detected in the detecting step that the broadcasting signal on the selected channel cannot be tuned in to, the channel selection frequency to the high frequency side or the low frequency side.

In the digital broadcasting channel selection method, the channel selection frequency corresponding to the selected channel is set, and the broadcasting signal is tuned in to using the set channel selection frequency. At this time, when it is detected that the broadcasting signal on the selected channel cannot be tuned in to, the channel selection frequency is shifted to the high frequency side or the low frequency side.

At the time of the channel selection after shifting the channel selection frequency, therefore, the broadcasting signal can be tuned in to using the channel selection frequency shifted to the high frequency side or the low frequency side. Even in a case where the center frequency of the carrier wave for the broadcasting signal on the selected channel is shifted from a nominal value and deviates from the lead-in range based on the first channel selection frequency, therefore, when the center frequency of the carrier wave for the broadcasting signal on the selected channel is in the lead-in range after the shifting, the broadcasting signal on the selected channel can be tuned in to. As a result, when the frequency precision of the carrier wave for the broadcasting signal is low, the broadcasting signal on the desired channel can be tuned in to.

It is preferable that the digital broadcasting channel selection method further comprises the steps of tuning in to the broadcasting signal again using the channel selection frequency shifted to the high frequency side or the low frequency side in the shifting step, detecting again whether or not the broadcasting signal on the selected channel can be tuned in to in the step of tuning again, and shifting, when it is detected in the step of detecting again that the broadcasting signal on the selected channel cannot be tuned in to, the channel selection frequency to the opposite side.

In this case, when it is detected again that the broadcasting signal on the selected channel cannot be tuned in to after the channel selection frequency is shifted to the high frequency side or the low frequency side, the channel selection frequency is shifted to the opposite side. When the center frequency of the carrier wave for the broadcasting signal on the selected channel is shifted in the opposite direction to the direction in which it is first shifted, therefore, it is possible to tune in to the broadcasting signal on the channel selected by shifting the channel selection frequency to the opposite side.

The shifting step may comprise the step of successively shifting the channel selection frequency to the high frequency side or the low frequency side until the broadcasting signal on the selected channel can be tuned in to.

In this case, the channel selection frequency is successively shifted to the high frequency side or the low frequency side until the broadcasting signal on the selected channel can be tuned in to. Even when the center frequency of the carrier wave for the broadcasting signal on the selected channel is greatly shifted, therefore, it is possible to tune in to the broadcasting signal on the selected channel by successively shifting the channel selection frequency.

It is preferable that the digital broadcasting channel selection method further comprises the step of stopping an operation for shifting the channel selection frequency when the broadcasting signal on the selected channel cannot be tuned in to after the channel selection frequency is shifted a predetermined number of times.

In this case, when the broadcasting signal on the channel selected after shifting the channel selection frequency a predetermined number of times cannot be tuned in to, the operation for shifting the channel selection frequency is stopped. In cases such as a case where the selected channel is not broadcast, therefore, a channel selection operation can be stopped without being uselessly continued.

It is preferable that the digital broadcasting channel selection method further comprises the step of recording on recording means for each channel, when it is detected in the detecting step that the broadcasting signal on the selected channel can be tuned in to, the amount of shift in the channel selection frequency corresponding to the channel, the setting step comprising the step of shifting, when the channel selection frequency is set, the channel selection frequency by the amount of shift recorded on the recording means.

In this case, when it is detected that the broadcasting signal on the selected channel can be tuned in to, the amount of shift in the channel selection frequency corresponding to the channel is recorded on the recording means, and the channel selection frequency is shifted by the amount of shift recorded on the recording means when the channel selection frequency is set. At the time of the subsequent channel selection, therefore, the channel can be tuned in to by shifting the channel selection frequency by an amount of shift in which the channel could be selected last time. Accordingly, the desired channel can be quickly tuned in to without performing a useless channel selection operation.

The digital broadcasting channel selection method may further comprise the step of recording on the recording means for each channel the result of the detection in the detecting step whether or not the broadcasting signal on the selected channel can be tuned in to.

In this case, the result of the detection whether or not the broadcasting signal on the selected channel can be selected is recorded on the recording means for each channel. When an instruction to select the same channel is issued since that time, for example, therefore, the viewer can be notified that the channel cannot be tuned in to, or the channel which cannot be tuned in to at the time of an auto-channel operation for automatically raising or lowering the channel can be skipped. Therefore, it is possible to restrain the operation for tuning in to the channel which may not be or is hardly tuned in to.

It is preferable that the tuning step comprises the step of converting the broadcasting signal tuned in to using the channel selection frequency set in the setting step into an intermediate frequency signal and outputting the intermediate frequency signal, the detecting step comprises the step of detecting whether or not the broadcasting signal on the selected channel can be tuned in to on the basis of the result of decoding of the intermediate frequency signal obtained by the conversion.

In this case, the broadcasting signal tuned in to is converted into the intermediate frequency signal, and it is detected whether or not the broadcasting signal on the selected channel can be tuned in to on the basis of the result of the decoding of the intermediate frequency signal obtained by the conversion. Accordingly, it can be detected whether or not the broadcasting signal is a broadcasting signal on the selected channel using the result of the decoding, for example, various types of information included in a transport stream. Accordingly, it is possible to reliably detect not only that the channel can be merely tuned in to but also whether or not the channel tuned in to is the selected channel. As a result, even when a plurality of broadcasting signals exist in the lead-in range based on the set channel selection frequency, the broadcasting signal on the channel selected by the viewer can be reliably tuned in to

BRIEF DESCRIPTION OF THE DRAWINGS

FIG. 2 is a schematic view showing an example of the data structure of a memory shown in FIG. 1.

BEST MODE FOR CARRYING OUT THE INVENTION

Figure 1:
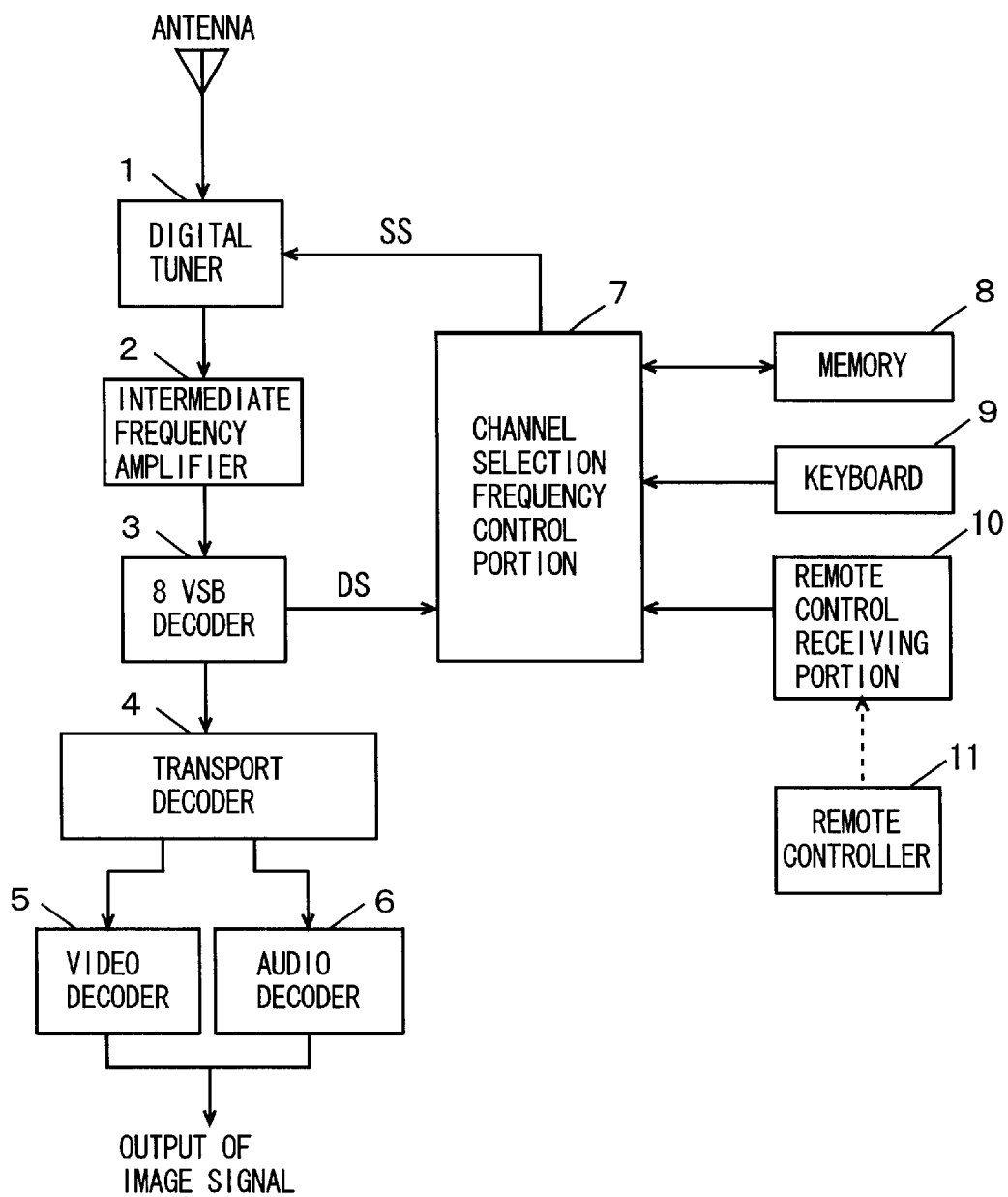
FIG. 1 is a block diagram showing the configuration of a digital broadcasting channel selection apparatus according to an embodiment of the present invention.

A digital broadcasting channel selection apparatus according to the present invention will be described while referring to the drawings. FIG. 1 is a block diagram showing the configuration of the digital broadcasting channel selection apparatus according to an embodiment of the present invention.

The digital broadcasting channel selection apparatus shown in FIG. 1 comprises a digital tuner 1, an intermediate frequency amplifier (VIF) 2, an 8VSB (Vestigial Sideband) decoder 3, a transport decoder 4, a video decoder 5, an audio decoder 6, a channel selection frequency control portion 7, a memory 8, a keyboard 9, a remote control receiving portion 10, and a remote controller 11.

The digital tuner 1 receives an RF signal in digital broadcasting from an antenna, a cable, or the like, tunes in to a broadcasting signal on a channel corresponding to a channel selection signal SS outputted from the channel selection frequency control portion 7, converts the RF signal into an IF signal, and outputs the IF signal to the intermediate frequency amplifier 2.

Specifically, the digital tuner 1 comprises a PLL circuit, a local oscillator circuit, and a mixing circuit (not shown). The inputted RF signal and a local oscillation signal outputted from the local oscillator circuit are mixed with each other by the mixing circuit, and the broadcasting signal, on the channel corresponding to the channel selection signal SS, in the RF signal is converted into an IF signal having a predetermined intermediate frequency. At this time, a local oscillation frequency $f_{OSC}$ of the local oscillation signal outputted from the local oscillator circuit is subjected to PLL control by the PLL circuit, so that the difference between the local oscillation frequency $f_{OSC}$ and the frequency $f_{RF}$ of the RF signal becomes an intermediate frequency $f_{IF}$ of the IF signal.

The intermediate frequency amplifier 2 amplifies the IF signal outputted from the digital tuner 1, and outputs the amplified IF signal to the 8VSB decoder 3. At this time, an output of the intermediate frequency amplifier 2 is fed back to the digital tuner 1, whose illustration is omitted, so that automatic fine tuning for controlling the local oscillation frequency $f_{OSC}$ is made such that the frequency of the IF signal becomes a predetermined intermediate frequency $f_{IF}$.

The 8VSB decoder 3 decodes the IF signal outputted from the intermediate frequency amplifier 2 in accordance with an octal vestigial sideband (8VSB) modulation system and corrects errors, to output to the transport decoder 4 header information and a transport stream composed of audio data and video data subsequent thereto. At this time, the 8VSB decoder 3 detects whether or not the broadcasting signal on the channel corresponding to the channel selection signal SS set by the channel selection frequency control portion 7 can be tuned in to using the decoded header information in the transport stream, to output the result of the detection to the channel selection frequency control portion 7 as a detection result signal DS.

Specifically, when the header information is obtained, it is considered that digital demodulation is completed, to judge that the broadcasting signal on the channel corresponding to the channel selection signal SS set by the channel selection frequency control portion 7 can be tuned in to. On the other hand, when the header information is not obtained, the digital demodulation is not completed, to judge that the broadcasting signal on the channel corresponding to the channel selection signal SS set by the channel selection frequency control portion 7 cannot be tuned in to.

It is thus detected whether or not the broadcasting signal tuned in to using the header information included in the transport stream is a broadcasting signal on a selected channel, thereby making it possible to reliably detect whether or not the selected channel can be tuned in to.

Furthermore, the header information includes information for specifying the channel in the transport stream. It may be detected whether or not the broadcasting signal tuned in to using the information is the broadcasting signal on the selected channel. In this case, it is possible to not only tune in to the channel but also reliably detect whether or not the channel tuned in to is the selected channel. As a result, even when a plurality of broadcasting signals exist in the lead-in range based on the channel selection signal SS, the broadcasting signal on the channel selected by the viewer can be reliably tuned in to.

Judgment whether or not the broadcasting signal on the selected channel can be tuned in to is not particularly limited to an example using the header information. The judgment may be made from other information included in the transport stream. Further, it may be judged whether or not a phase can be locked by PLL control in the digital tuner 1, or may be judged whether or not the IF signal is at a sufficient level.

The transport decoder 4 decodes the transport stream outputted from the 8VSB decoder 3 to separate the decoded transport stream into an elementary stream of a video and an elementary stream of an audio, and respectively outputs the elementary streams to the video decoder 5 and the audio decoder 6.

The video decoder 5 and the audio decoder 6 decode the elementary stream of the video and the elementary stream of the audio which are outputted from the transport decoder 4 in accordance with an MPEG (Moving Picture Experts Group) standard, so that a compressed signal is expanded. A digital image signal and a digital voice signal obtained by the expansion are converted into analog signals, and the analog signals are outputted to a display device (not shown).

The channel selection frequency control portion 7 receives a channel signal corresponding to a channel selected by a viewer using the keyboard 9 or the remote controller 11 from the remote controller 11 through the keyboard 9 or the remote control receiving portion 10, reads out the PLL data corresponding to the inputted channel signal from the memory 8, and outputs the PLL data read out to the digital tuner 1 as a channel selection signal SS.

The PLL data is data corresponding to the local oscillation frequency outputted from the local oscillator circuit in the digital tuner 1. The local oscillator circuit outputs a local oscillation signal having a local oscillation frequency corresponding to the PLL data, so that a broadcasting signal corresponding to the channel selected by the viewer is tuned in to by the digital tuner 1.

The data used as the channel selection signal SS serving as a channel selection frequency is not particularly limited to that in the above-mentioned example. If the digital tuner 1 can select a desired channel using the data, various types of data can be used. For example, data representing the center frequency $f_{RF}$ of the carrier wave for the broadcasting signal on the channel selected by the viewer may be used. In this case, in the local oscillator circuit, the local oscillation frequency $f_{OSC}$ obtained by adding the intermediate frequency $f_{IF}$ to the center frequency $f_{RF}$ of the carrier wave for the broadcasting signal is outputted. In the same manner as described above, the broadcasting signal on the channel selected by the viewer is converted into an IF signal, and the IF signal is outputted.

On the memory 8, the PLL data on each of the channels in digital broadcasting is previously recorded for the channel, and the result of detection based on the detection result signal DS outputted from the 8VSB decoder 3 by the channel selection frequency control portion 7 is recorded for the channel.

The keyboard 9 is constituted by a plurality of input keys, for example, and outputs a channel signal used for selecting a channel by a viewer, for example, and corresponding to the channel selected by the viewer to the channel selection frequency control portion 7.

The remote controller 11 comprises a plurality of input keys, for example, and transmits a channel signal corresponding to the channel selected by the viewer to the remote control receiving portion 10. The remote control receiving portion 10 outputs the channel signal transmitted from the remote controller 11 to the channel selection frequency control portion 7.

Furthermore, the channel selection frequency control portion 7 shifts the PLL data in response to the detection result signal DS outputted from the 8VSB decoder 3, and outputs the shifted PLL data to the digital tuner 1 as a channel selection signal SS.

Specifically, when the detection result signal DS indicates that a broadcasting signal on the selected channel cannot be tuned in to, that is, digital demodulation cannot be performed by the 8VSB decoder 3, the channel selection frequency control portion 7 shifts the PLL data by a predetermined frequency and outputs the PLL data to the digital tuner 1.

On the other hand, when the detection result signal DS indicates that the broadcasting signal on the selected channel can be tuned in to, that is, digital demodulation is completed, the channel selection frequency control portion 7 instructs the digital tuner 1 to lock the PLL data represented by the outputted channel selection signal SS and records on the memory 8 the fact that the channel can be selected as the result of the channel selection in correspondence with the channel, and records, when the PLL data is shifted, the amount of the shift on the memory 8 in correspondence with the channel.

When the digital demodulation cannot be performed by the 8VSB decoder 3 after a shifting operation is performed a predetermined number of times, the channel selection frequency control portion 7 records on the memory 8 the fact that the channel cannot be selected in correspondence with the channel as the result of the channel selection.

FIG. 2 is a schematic view showing an example of the data structure of the memory 8 shown in FIG. 1. As shown in FIG. 2, the memory 8 records the PLL data, the amount of shift, and the result of the channel selection for each channel, that is, for each channel number.

The amount of shift is the difference between a nominal value of the center frequency of the carrier wave for each of the channels and the center frequency of a carrier wave on the channel which can be actually tuned in to. The frequency of the PLL data is shifted by the amount of shift, thereby making it possible to directly tune in to the channel. As the result of the channel selection, for each channel, data corresponding to "○" indicating that the channel can be selected is recorded when the channel can be selected, while data corresponding to "×" indicating that the channel cannot be selected is recorded when the channel cannot be selected.

In the example shown in FIG. 2, when the channel number is 2, for example, $f_2$ (kHz) is recorded as the PLL data, and +0 (kHz) is recorded as the amount of shift. Consequently, it is found that the center frequency of the carrier wave on the channel is not shifted at the time of the past channel selection, and it is found that the channel can be selected without shifting the PLL data at the time of the subsequent channel selection. Further, "○" is recorded as the result of the channel selection, so that the fact that the channel can be selected at the time of the past channel selection is recorded.

When the channel number is 3, $f_3$ (kHz) is recorded as the PLL data, and $+f_A$ (kHz) is recorded as the amount of shift. Consequently, it is found that the center frequency of the carrier wave on the channel is shifted by $+f_A$ (kHz) at the time of the past channel selection, and it is found that the channel can be selected by shifting the PLL data by the amount of shift at the time of the subsequent channel selection.

Furthermore, when the channel number is 4, $f_4$ (kHz) is recorded as the PLL data. However, "×" is recorded as the result of the channel selection, and the fact that the channel cannot be selected at the time of the past channel selection is recorded. The result of the channel selection as to whether or not a broadcasting signal on the selected channel can be selected is thus recorded on the memory 8 for the channel. When an instruction to tune in to the same channel is issued since that time, for example, the viewer can be notified that the channel cannot be tuned in to. Alternatively, the channel which cannot be tuned in to at the time of an auto-channel operation for automatically raising or lowering the channel can be skipped, thereby making it possible to restrain an operation for tuning in to the channel which may not be or is hardly tuned in to.

In the present embodiment, the keyboard 9, the remote control receiving portion 10, and the remote controller 11 correspond to selection means, the channel selection frequency control portion 7 corresponds to frequency setting means, the digital tuner 1 and the intermediate frequency amplifier 2 correspond to tuning means, the 8VSB decoder 3 corresponds to detection means, and the memory 8 corresponds to recording means.

Figure 3:
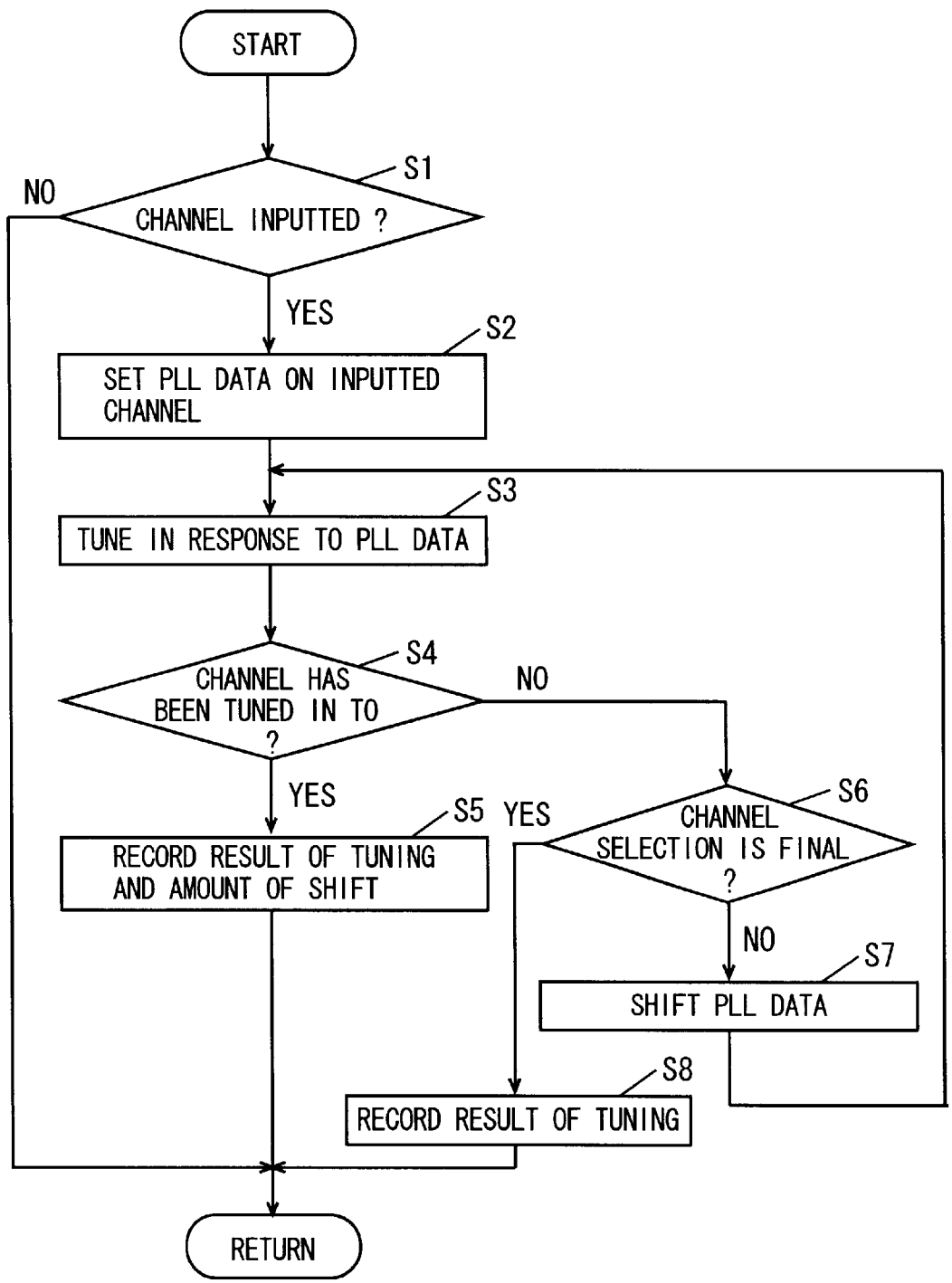
FIG. 3 is a flow chart for explaining a channel selection operation in the digital broadcasting channel selection apparatus shown in FIG. 1.

Description is now made of a channel selection operation in the digital broadcasting channel selection apparatus constructed as described above. FIG. 3 is a flow chart for explaining the channel selection operation in the digital broadcasting channel selection apparatus shown in FIG. 1.

In the present embodiment, the channel selection frequency control portion 7 is constituted by a microcomputer or the like, to perform an operation, described later, by executing a predetermined program. However, the present embodiment is not particularly limited to an example by software. For example, the channel selection frequency control portion may be composed of dedicated hardware to perform the same operations.

At the step S1 the channel selection frequency control portion 7 first detects whether or not the viewer selects a channel by the keyboard 9 or the remote controller 11, and a channel signal on the channel is inputted. When the channel signal is inputted, the program proceeds to the step S2. When the channel signal is not inputted, the processing at the step S1 is repeated.

When the channel signal is inputted, at the step S2, the channel selection frequency control portion 7 reads out the PLL data corresponding to the inputted channel signal from the memory 8, and outputs the read PLL data to the digital tuner 1 as a channel selection signal SS.

At this time, the channel selection frequency control portion 7 shifts, when the amount of shift is set with respect to the channel selected by the viewer, the PLL data by the amount of shift recorded on the memory 8, to output the PLL data to the digital tuner 1 as a channel selection signal SS and output the PLL data as the channel selection signal SS as it is when the amount of shift is zero. When the selected channel has already been tuned in to, therefore, the PLL data can be shifted by an amount of shift in which the channel could be tuned in to last time to tune in to the channel. Accordingly, the desired channel can be quickly tuned in to without performing a useless channel selection operation.

At the step S3, the digital tuner 1 then tunes in to the broadcasting signal from the RF signal in response to the PLL data represented by the inputted channel selection signal SS to output an IF signal. The intermediate frequency amplifier 2 amplifies the outputted IF signal, and the 8VSB decoder 3 decodes the amplified IF signal. At this time, the 8VSB decoder 3 detects whether or not the header information is included in the decoded transport stream, and outputs the result of the detection to the channel selection frequency control portion 7 as a detection result signal DS.

At the step S4, the channel selection frequency control portion 7 then judges whether or not the selected channel can be tuned in to from the detection result signal DS. When the selected channel can be tuned in to, the program proceeds to the step S5. When the selected channel cannot be tuned in to, the program proceeds to the step S6.

When the selected channel can be tuned in to at the step S5, the channel selection frequency control portion 7 instructs the digital tuner 1 to maintain PLL control corresponding to the PLL data, and records on the memory 8 the fact that the channel can be selected as the result of the channel selection of the selected channel and records on the memory 8 the amount of shift in the PLL data in a case where the channel can be selected. Thereafter, the program proceeds to the step S1, to repeat the subsequent processing. In the case of the first channel selection operation, an operation for shifting the PLL data is not performed. Accordingly, 0 (kHz) is recorded as the amount of shift, and "○" is recorded as the result of the channel selection.

On the other hand, when the selected channel cannot be tuned in to, the channel selection frequency control portion 7 judges at the step S6 whether or not the current channel selection is the final channel selection. When the final channel selection is carried out, the program proceeds to the step S8. When the final channel selection is not carried out, the program proceeds to the step S7.

When the channel selection is not the final channel selection, the channel selection frequency control portion 7 shifts the PLL data by a predetermined frequency at the step S6. At the step S6, the shifted PLL data is outputted to the digital tuner 1 as a channel selection signal SS.

At the step S3, the digital tuner 1, the intermediate frequency amplifier 2, and the 8VSB decoder 3 are then operated, as in the foregoing, and the result of the detection by the current channel selection operation is outputted to the channel selection frequency control portion 7 as a detection result signal DS. At this time, the channel selection frequency control portion 7 judges again whether or not the selected channel can be tuned in to at the step S4. When the selected channel cannot be tuned in to, the steps S6, S7, and S3 are repeated until the final channel selection is carried out, so that the PLL data is successively shifted to the high frequency side or the low frequency side.

On the other hand, when the selected channel can be tuned in to (YES at step S4), the program proceeds to the step S5. At the step S5, the channel selection frequency control portion 7 records on the memory 8 the fact that the channel can be selected as a result of tuning in to the selected channel, and records on the memory 8 the amount of shift in the PLL data in a case where the channel can be selected. Thereafter, the program proceeds to the step SI, to repeat the subsequent steps. In the case of the second and the subsequent channel selection operations, the PLL data is shifted. The amount of the shift is recorded, and "○" is recorded as the result of the channel selection.

It is detected that the selected channel cannot be tuned in to (NO at step S4), and the channel selection is the final channel selection (YES at step S6), the channel selection frequency control portion 7 records on the memory 8 the fact that the channel cannot be selected, that is, "×" as the result of the channel selection.

When the broadcasting signal on the channel selected after shifting the PLL data a predetermined number of times cannot be thus tuned in to, the operation for shifting the PLL data is stopped. In cases such as a case where the selected channel is not broadcast, the channel selection operation can be stopped without being uselessly continued.

The PLL data may be successively shifted to the high frequency side or the low frequency side until the broadcasting signal on the selected channel can be tuned in to without limiting the upper limit of the number of times of channel selection. In this case, even when the center frequency of the carrier wave for the broadcasting signal on the selected channel is greatly shifted, it is possible to tune in to the broadcasting signal on the channel selected by successively shifting the channel selection frequency.

Figure 4:
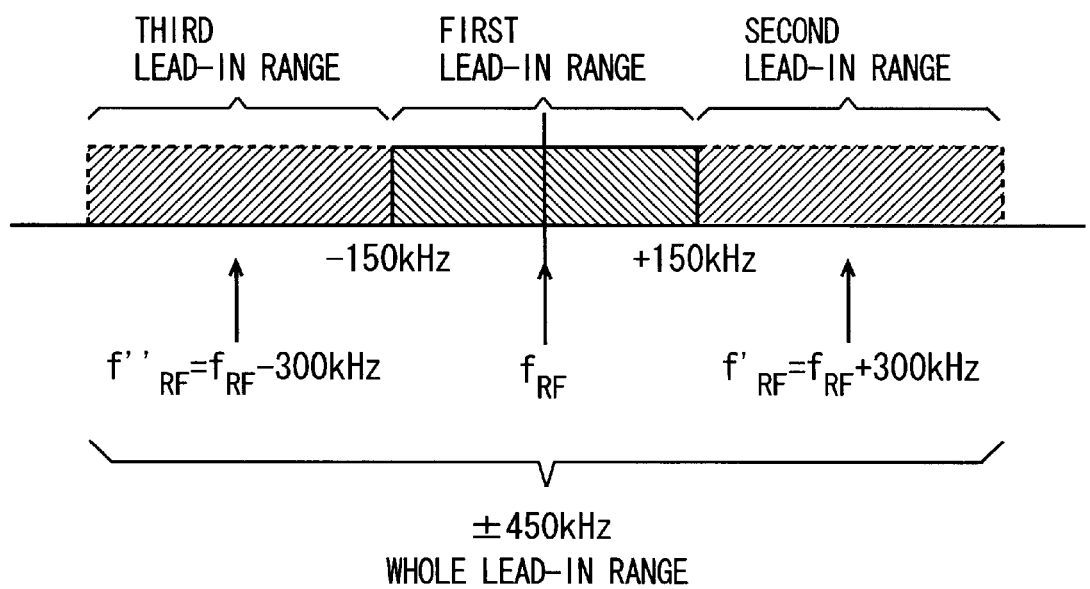
FIG. 4 is a schematic view showing an example of the lead-in range in the digital broadcasting channel selection apparatus shown in FIG. 1.

In the present embodiment, the PLL data is successively shifted in the following manner, for example, in accordance with the above-mentioned channel selection operation. FIG. 4 is a schematic view showing an example of the lead-in range in the digital broadcasting channel selection apparatus shown in FIG. 1.

As shown in FIG. 4, the channel selection frequency control portion 7 outputs the PLL data as it is at the time of the first channel selection, and the digital timer 1 tunes in to the broadcasting signal by taking as the lead-in range a range of ±150 kHz, centered at a nominal value $f_{RF}$ (kHz) of the center frequency of the carrier wave for the broadcasting signal on the selected channel.

When the broadcasting signal on the channel selected at the time of the first channel selection cannot be then tuned in to, the channel selection frequency control portion 7 shifts the PLL data to the high frequency side by 300 kHz at the time of the second channel selection, and the digital tuner 1 tunes in to the broadcasting signal by taking as the lead-in range a range of ±150 kHz, centered at a center frequency $f'_{RF}$ $(=f_{RF}+300)$ (kHz) shifted by 300 kHz to the high frequency side from the nominal value $f_{RF}$. When the center frequency of the carrier wave for the broadcasting signal on the selected channel is shifted to the high frequency side, therefore, the broadcasting signal on the selected channel can be tuned in to.

When the broadcasting signal on the channel selected at the time of the second channel selection cannot be tuned in to, the channel selection frequency control portion 7 then shifts the PLL data to the low frequency side by 300 kHz at the time of the third channel selection, and the digital tuner 1 tunes in to the broadcasting signal by taking as a lead-in range a range of ±150 kHz, centered at a center frequency $f''_{RF}$ $(=f_{RF}-300)$ (kHz) shifted by 300 kHz to the low frequency side from the nominal value $f_{RF}$. Even when the center frequency of the carrier wave for the broadcasting signal on the selected channel is shifted to the low frequency side, therefore, the broadcasting signal on the selected channel can be tuned in to.

The number of times of channel selection is limited to a predetermined number of times in order not to infinitely repeat the channel selection operation. In the example shown in FIG. 4, the third channel selection is previously set as the final channel selection. When the broadcasting signal on the channel selected at the time of the third channel selection cannot be tuned in to, therefore, the channel selection frequency control portion 7 stops the shifting operation. The number of times of channel selection is not particularly limited to that in the above-mentioned example. A reasonable number of times by which the selected channel can be tuned in to is set without unnecessarily making the viewer wait in consideration of the time for channel selection processing, the lead-in range by the PLL control, and so forth. Although in the example shown in FIG. 4, the lead-in ranges are set such that they are not overlapped with each other, the lead-in ranges may be set such that their parts are not overlapped with each other in consideration of a margin in the apparatus, for example.

As described in the foregoing, in the example shown in FIG. 4, the PLL data is successively shifted, thereby making it possible to take as a lead-in range a range of ±450 kHz, centered at the nominal value $f_{RF}$ (kHz) of the center frequency of the carrier wave for the broadcasting signal on the selected channel as well as to sufficiently enlarge the lead-in range.

As described in the foregoing, in the present embodiment, when the broadcasting signal is tuned in to using the PLL data corresponding to the selected channel, and it is detected that the broadcasting signal on the selected channel cannot be tuned in to, the PLL data is shifted to the high frequency side. Further, when the detection cannot be made, the PLL data is shifted to the low frequency side, and the lead-in range is sufficiently enlarged. Even when the center frequency of the carrier wave for the broadcasting signal on the selected channel is shifted from the nominal value and deviates from the first lead-in range, therefore, the broadcasting signal on the selected channel can be tuned in to using the lead-in range after the shifting. As a result, even when the frequency precision of the carrier wave for the broadcasting signal is low, the broadcasting signal on the desired channel can be tuned in to.

A method of shifting the PLL data is not particularly limited to the above-mentioned example. Various types of changes can be made. For example, the PLL data may be first shifted to the low frequency side, successively shifted to the low frequency side or the high frequency side, shifted to the low frequency side or the high frequency side a plurality of numbers of times and then shifted to the opposite side a plurality of numbers of times, or shifted alternately to the low frequency side or the high frequency side a plurality of numbers of times.

What is claimed is:

1. A digital broadcasting channel selection apparatus for tuning in to a broadcasting signal on a channel selected from digital broadcasting, comprising:
    a selector that selects a channel in digital broadcasting;
    a frequency setter that sets a channel selection frequency corresponding to the channel selected by said selector;
    a tuner that tunes in to the broadcasting signal using the channel selection frequency set by said frequency setter;
    a detector that detects whether or not said tuner can tune in to the broadcasting signal on the selected channel and notifying said frequency setter of the result of the detection; and
    a recorder that records for each channel the amount of shift in the channel selection frequency corresponding to the channel;
    said frequency setter shifting, when said detector detects that said tuner cannot tune in to the broadcasting signal on the selected channel, said channel selection frequency to the high frequency side or the low frequency side; and
    said frequency setter recording, when said detector detects that said tuner can tune in to the broadcasting signal on the selected channel, the amount of shift in the channel selection frequency corresponding to the channel on said recorder as well as shifting the channel selection frequency by the amount of shift recorded on said recorder when the channel selection frequency is set in said tuner.

2. The digital broadcasting channel selection apparatus according to claim 1, wherein
    said frequency setter shifts said channel selection frequency to the high frequency side or the low frequency side and then shifts, when said detector detects again that said tuner cannot tune in to the broadcasting signal on the selected channel, said channel selection frequency to the opposite side.

3. The digital broadcasting channel selection apparatus according to claim 1, wherein
    said frequency setter successively shifts said channel selection frequency to the high frequency side or the low frequency side until said tuner can tune in to the broadcasting signal on the selected channel.

4. The digital broadcasting channel selection apparatus according to claim 1, wherein
    said frequency setter stops an operation for shifting the channel selection frequency when said tuner cannot tune in to the broadcasting signal on the selected channel after said channel selection frequency is shifted a predetermined number of times.

5. The digital broadcasting channel selection apparatus according to claim 1, wherein
    said frequency setter records on said recorder for each channel the result of the detection whether or not said tuner can tune in to the broadcasting signal on the selected channel.

6. The digital broadcasting channel selection apparatus according to claim 1, wherein
    said tuner converts the broadcasting signal tuned in to using the channel selection frequency set by said frequency setter into an intermediate frequency signal and outputs the intermediate frequency signal, and
    said detector detects whether or not the broadcasting signal on the selected channel can be tuned in to on the basis of the result of decoding of the intermediate frequency signal outputted from said tuner.

7. A digital broadcasting channel selection method for tuning in to a broadcasting signal on a channel selected from digital broadcasting comprising the steps of:
    setting a channel selection frequency corresponding to the selected channel;
    tuning in to the broadcasting signal using the set channel selection frequency;
    detecting whether or not the broadcasting signal on the selected channel can be tuned in to in said tuning step;
    shifting, when it is detected in said detecting step that the broadcasting signal on the selected channel cannot be tuned in to, said channel selection frequency to the high frequency side or the low frequency side; and
    recording on recorder for each channel, when it is detected in said detecting step that the broadcasting signal on the selected channel can be tuned in to, the amount of shift in the channel selection frequency corresponding to the channel;
    said setting step comprising the step of shifting, when said channel selection frequency is set, the channel selection frequency by the amount of shift recorded on said recorder.

8. The digital broadcasting channel selection method according to claim 7, further comprising the steps of:
    tuning in to the broadcasting signal again using the channel selection frequency shifted to the high frequency side or the low frequency side in said shifting step,
    detecting again whether or not the broadcasting signal on the selected channel can be tuned in to in said step of tuning again, and
    shifting, when it is detected in said step of detecting again that the broadcasting signal on the selected channel cannot be tuned in to, the channel selection frequency to the opposite side.

9. The digital broadcasting channel selection method according to claim 7, wherein
    said shifting step comprises the step of successively shifting said channel selection frequency to the high frequency side or the low frequency side until the broadcasting signal on the selected channel can be tuned in to.

10. The digital broadcasting channel selection method according to claim 7, further comprising the step of stopping an operation for shifting the channel selection frequency when the broadcasting signal on the selected channel cannot be tuned in to after said channel selection frequency is shifted a predetermined number of times.

11. The digital broadcasting channel selection method according to claim 7, further comprising the step of:

recording on said recorder for each channel the result of the detection in said detecting step whether or not the broadcasting signal on the selected channel can be tuned in to.

12. The digital broadcasting channel selection method according to claim 7, wherein said tuning step comprises the step of converting the broadcasting signal tuned in to using the channel selection frequency set in said setting step into an intermediate frequency signal and outputting the intermediate frequency signal, and said detecting step comprises the step of detecting whether or not the broadcasting signal on the selected channel can be tuned in to on the basis of the result of decoding of the intermediate frequency signal obtained by the conversion.

\* \* \* \* \*